United States Patent [19]

Tsukuda et al.

[11] Patent Number: 5,065,111

[45] Date of Patent: Nov. 12, 1991

[54] DIFFERENTIAL AMPLIFYING CIRCUIT OPERABLE AT HIGH SPEED

[75] Inventors: Akinori Tsukuda; Masahisa Nemoto; Haruo Mori, all of Tokyo, Japan

[73] Assignee: Oki Electric Industry Co., Ltd., Tokyo, Japan

[21] Appl. No.: 535,029

[22] Filed: Jun. 8, 1990

[30] Foreign Application Priority Data

Jun. 12, 1989 [JP] Japan .................. 1-148749

[51] Int. Cl.$^5$ .............................................. H03F 3/45
[52] U.S. Cl. ..................................... 330/253; 330/311
[58] Field of Search ................. 330/253, 257, 311; 307/355, 356, 362

[56] References Cited

FOREIGN PATENT DOCUMENTS 60-158708 8/1985 Japan .
64-7522 2/1989 Japan .

OTHER PUBLICATIONS

Wyland, "FET Cascade Technique Optimzes Differential Amplifier Performance", *Electronics*, Jan. 18, 1971, vol. 44, No. 2, pp. 81-84.

Primary Examiner—James B. Mullins
Attorney, Agent, or Firm—Wenderoth, Lind & Ponack

[57] ABSTRACT

A differential amplifying circuit includes a differential input portion, a load portion, a switching portion, and a constant current source. The differential input portion is connected to the constant current source, and includes a pair of field effect transistors (FETs), with one having a gate for receiving an input voltage, a source connected to the current source and a drain connected to a first node, and the other having a gate for receiving a reference voltage, a source connected to the current source and a drain connected to a second node. The load portion includes a pair of FETs, with one having a drain connected to a first power source and a source connected to a first output terminal, and the other having a drain connected to the first power source and a source connected to a second output terminal. The switching portion includes a pair of FETs, with one having a source connected to the first output terminal, and the other having a source connected to the second output terminal. The pair of FETs of the load portion respond to the potentials of the first and second nodes, respectively, so that the switching portion can perform a high speed switching operation.

7 Claims, 7 Drawing Sheets

DIFFERENTIAL AMPLIFYING CIRCUIT OPERABLE AT HIGH SPEED

BACKGROUND OF THE INVENTION

1. Field of the Invention

The present invention relates to a differential amplifying circuit of the type using field effect transistors (FETs) and applicable to semiconductor integrated circuits or similar circuitry. More particularly, the present invention is concerned with a differential amplifying FET circuit with a common source connection circuit formed on a compound semiconductor (for example, gallium arsenide) substrate.

2. Description of the Prior Art

A differential amplifying circuit described above has been proposed in various forms in the past. To better understand the present invention, a brief reference will be made to some prior art differential amplifying circuits.

FIG. 1 shows a prior art differential amplifying circuit with input terminals 10 and 12. An input voltage VI and a reference voltage VR1 are applied to the input terminals 10 and 12, respectively. A differential input section 14 is connected to the input terminals 10 and 12 and has a pair of enhancement type FETs 16 and 18. The FET 16 is turned on and off by the input voltage VI, while the FET 18 is turned on and off by the reference voltage VR1. The FETs 16 and 18 have drains connected to a load section 20, and sources connected to a negative power source voltage VSS via an enhancement type FET 22. This FET 22 plays the role of a constant current source.

The load section 20 has a depletion type FET 24 connected between a positive power source voltage VDD and the drain of the FET 16, and a depletion type FET 26 connected between the power source voltage VDD and the drain of the FET 18. The FETs 24 and 26 serve as load elements. Output terminals 28 and 30 on which output voltages out1 and out2 appear, respectively, are connected to the drains of the FETs 16 and 18, respectively. In FIG. 1, the reference numeral 32 designates an input terminal assigned to a reference voltage VR2.

In operation, when the input voltage VI applied to the input terminal 10 is higher than the reference voltage VR1, the FET 16 is turned on with the result that the potential at the output terminal 28 turns from a high level or "H" to a low level or "L". Then, a current flows into the amplifying circuit via the output terminal 28. This incoming current and the current from the load FET 24 join each other and flow together into the negative power source voltage VSS via the constant current source 22. At this time, the potential at the output terminal 30 turns to a high level because the FET 18 remains in an OFF state. Consequently, a current flows out to a succeeding circuit, not shown, from the power source voltage VDD via the FET 26 and output terminal 30.

On the other hand, when an input voltage VI lower than the reference voltage VR1 arrives at the input terminal 10, the FET 16 is turned off resulting in the output terminal 28 being at a high level. As a result, a current flows out from the power source voltage VDD to the succeeding circuit via the FET 24 and output terminal 28. Since the FET 18 is an ON state, the potential at the output terminal 30 turns from a high level to a low level with the result that a current flows into the amplifying circuit via the output terminal 30. This current and a current from the FET 26 join each other and flow together into the negative power source voltage VSS via the FET 18 and constant current source 22.

The prior art differential amplifying circuit having the above construction uses the FETs 24 and 26 as load elements and selects a saturation drain current of such elements which is substantially one half the current of the constant current source 22. A drawback with this configuration is that when the input voltage VI having a great amplitude arrives, the resultant output waveform appears stepwise and is thereby degraded.

FIG. 2 shows another prior art differential amplifying circuit which is disclosed in Japanese Patent Publication No. 7522/1989. In the figures, the same components are designated by like reference numerals, and redundant descriptions will be avoided for simplicity. The circuit of FIG. 2 is distinguishable over the circuit of FIG. 1 in that depletion type FETs 40 and 42 are provided in place of the load FETs 24 and 26, and that Zener diodes 44 and 46 are respectively connected in parallel with the FETs 40 and 42 in opposite directions. In FIG. 2, the reference numerals 47 and 48 designate input terminals assigned to input voltages VI1 and VI2, respectively.

In the circuitry shown in FIG. 2, when the voltage across the FET or load 40 or 42 increases beyond a predetermined value, a current flows through the associated Zener diode 44 or 46 to reduce the load resistance of the FET 16 or 18. It follows that the output waveform is protected against deterioration even when the input voltage VI has a great amplitude. However, this prior art differential amplifying circuit has a problem left unsolved, as follows.

Specifically, when the output terminal 28, for example, is at a low level, a discharge current flows into the amplifying circuit from a succeeding circuit, not shown. Since, the sum of the discharge current and the current from the load FET 40 constitutes the current of the constant current source 22, the discharge current is limited by the current from the FET 40. On the other hand, when the potential at the output terminal 28 is changed from a low level to a high level, a charge current flows out to the succeeding circuit. At this time, the current from the load FET 40 is the charge current because the FET 16 is in an OFF state. Since the saturation drain current of the FET 40 is selected to be one half the current of the constant current source 22, such a charge current is limited by the saturation drain current. In this manner, the discharge current from and the charge current to the succeeding circuit are limited, impeding the increase in the operating speed of the circuit.

SUMMARY OF THE INVENTION

It is therefore an object of the present invention to provide a differential amplifying circuit which eliminates the drawbacks particular to the prior art as discussed above.

It is another object of the present invention to provide a differential amplifying circuit which is operable at high speed.

It is another object of the present invention to provide a differential amplifying circuit capable of feeding a large current as required by a succeeding circuit, while cutting down power consumption.

In accordance with the present invention, a differential amplifying circuit comprises a first FET of which conduction between a drain and a source is controlled by an input voltage, a second FET of which conduction between a drain and a source is controlled by a first reference voltage, a constant current source connected between the sources of the first and second FETs and a low potential power source, a third or load FET having a drain connected to a high potential power source and having a source and a gate connected to a first node which is connected to the drain of the first FET, a fourth or load FET having a drain connected to the high potential power source and having a source and a gate connected to a second node which is connected to the drain of the second FET, a fifth FET connected between the source of the third FET and the first node and of which conduction is controlled by a second reference voltage, and a sixth FET connected between the source of the fourth FET and the second node and of which conduction is controlled by the second reference voltage.

In a preferred embodiment of the present invention, the third and fourth FETs each is implemented by a depletion type FET.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 3:
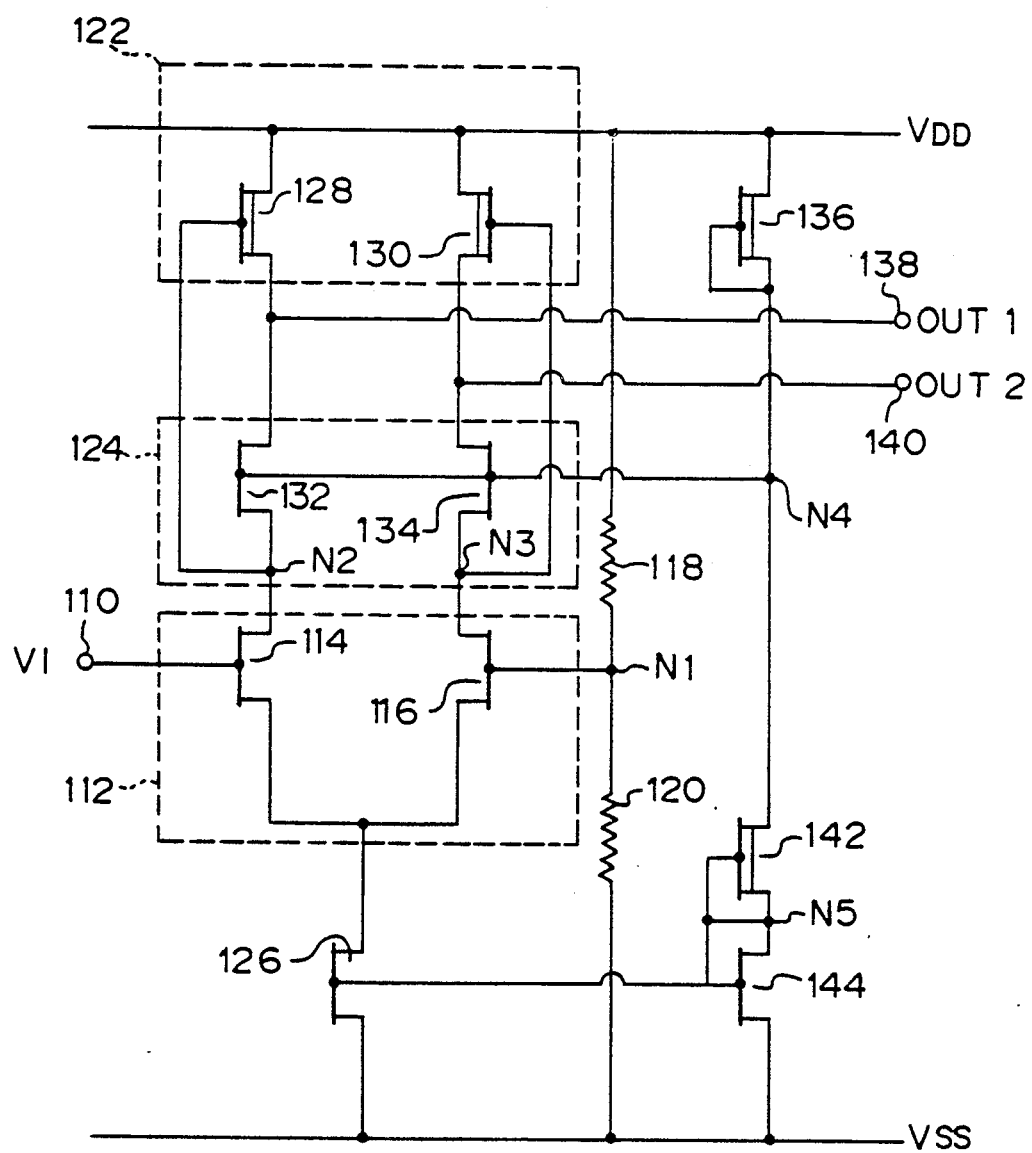
FIG. 3 is a diagram representative of a differential amplifying circuit embodying the present invention.

FIG. 3 shows a differential amplifying circuit embodying the present invention. As shown, the circuit has an input terminal 110 to which an input voltage VI is applied, and a differential input section 112 connected to the input terminal 110. The differential input section 112 is made up of enhancement type FETs 114 and 116. The enhancement type FET 114 is connected to the input terminal 110, while the enhancement type FET 116 is connected to a node N1 on which a first reference voltage VR1 appears. Resistors 118 and 120 are connected between the node N1 and a high potential power source VDD and between the node N1 and a low potential power source VSS, respectively. The drains of the FETs 114 and 116 are connected at nodes N2 and N3, respectively, to a load section 122 and a switch section 124. The sources of the FETs 114 and 116 are connected to the low potential power source VSS via an enhancement type FET 126 which plays the role of a constant current source.

The load section 122 has a depletion type FET 128 which has its gate connected to the node N2, and a depletion type FET 130 which has its gate connected to the node N3. The FETs 128 and 130 serve as load elements. The source voltage VDD is connected to the drains of the FETs 128 and 130, while the switch section 124 is connected to the sources of the FETs 128 and 130.

The switch section 124 has an enhancement type FET 132 whose drain is connected to the source of the FET 128, and an enhancement type FET 134 whose drain is connected to the source of the FET 130. The gates of the FETs 132 and 134 are connected commonly to a node N4 which is held at a second reference voltage VR2. A depletion type FET 136 adapted for a load is connected between the node N4 and the power source voltage VDD. The drain of the FET 132 is connected to an output terminal 138 assigned to an output voltage OUT1, while the drain of the FET 134 is connected to an output terminal 140 assigned to an output voltage OUT2.

A depletion type FET 142 and an enhancement type FET 144 generate a constant voltage. The FET or constant current source 126 causes a constant current to flow at all times between the drain and the source thereof on the basis of the constant voltage which is generated by the FETs 142 and 144 as mentioned above. Specifically, the gate of the FET 126 is connected to the gates of the FETs 142 and 144 which are in turn connected to a node N5. The FETs 142 and 144 are connected in series between the node N4 and the power source voltage VSS via the node N5.

The differential input section 112 serves the function of a circuit for controlling the FETs 114 and 116 on and off by detecting a difference between the reference voltage VR1 and the input voltage VI. In the switching section 124, the FETs 132 and 134 perform switching operations on the basis of the reference voltage VR2 so as to change the state of current flow sharply, whereby the logical levels of the output terminals 138 and 140 are reproduced surely and rapidly.

Figure 4:
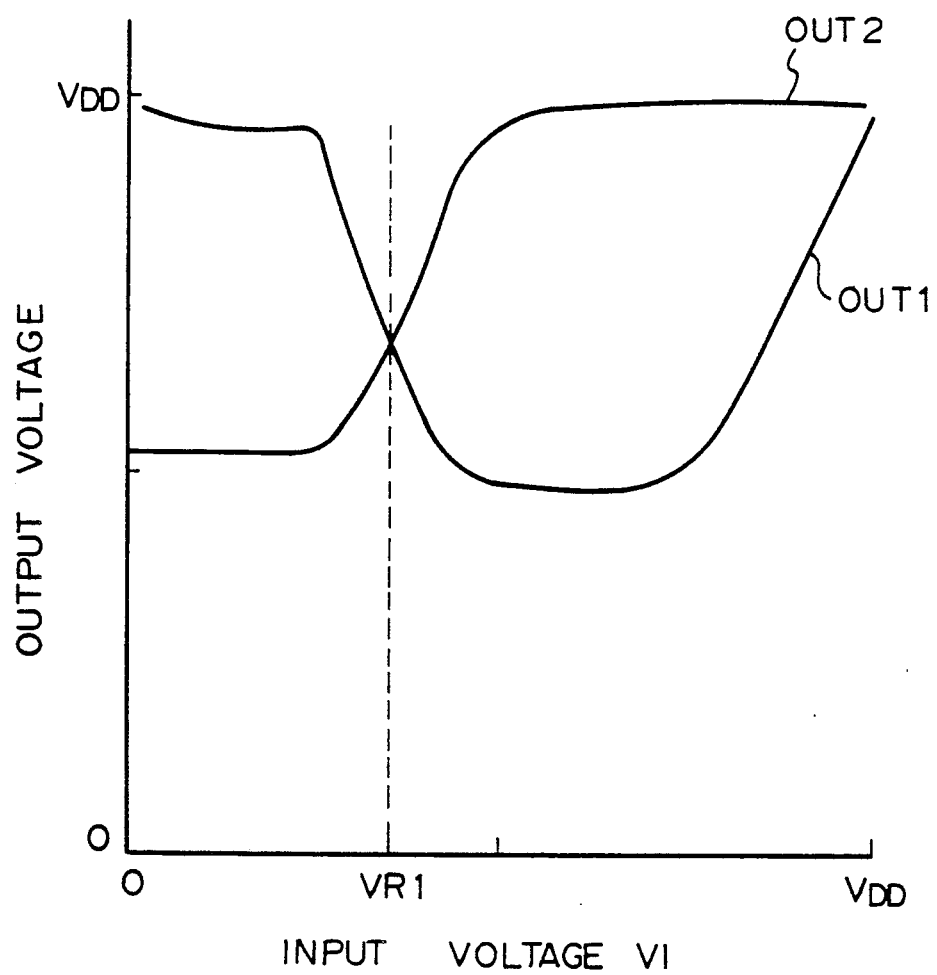
FIG. 4 is a graph demonstrating the operation of the illustrative embodiment shown in FIG. 3.

The operation of the circuitry constructed as shown in FIG. 3 will be described with reference to the waveforms shown in FIG. 4. When the input voltage VI applied to the input terminal 110 is higher than the reference voltage VR1, i.e., at a high level or "H", the FET 114 is turned on with the result that the current flowing between the drain and the source thereof is increased to in turn lower the voltage appearing on the node N2. As soon as the voltage on the node N2 is sufficiently lowered below the second reference voltage VR2, the FET 132 is turned on to increase the current flowing between the drain and the source thereof. As a result, the output voltage OUT1 is brought to a low level or "L", as shown in FIG. 4. In this instance, since the gate voltage of the FET 128 is equal to the voltage on the node N2, the FET 128 is turned off when the voltage on the node N2 decreases beyond a predetermined value. Then, a current which does not exceed the capacity of the FET 126 flows into the amplifying circuit via the output terminal 138 because the FETs 114 and 132 have been turned on.

The current coming in via the output terminal 138 turns off the FET 116 and thereby increases the voltage on the node N3. As the voltage on the node N3 rises nearly to the second reference voltage VR2, the FET 134 is turned off with the result that the output voltage OUT2 is turned from the low level to the high level, as shown in FIG. 4. Since the gate voltage of the FET 130 is equal to the voltage appearing on the node N3, the FET 130 turns off at the instant when the voltage on the node N3 rises above a predetermined value. Then, since the FETs 116 and 134 are in their OFF state, the current flows out to a succeeding circuit, not shown, via the output terminal 140 within the range which the FET 130 accommodates.

On the decrease of the input voltage VI from a high level to a low level, the FET 114 is turned off to in turn increase the voltage appearing on the node N2. When the voltage on the node N2 increases to nearly the second reference voltage VR2, the FET 132 is turned off and, therefore, the output voltage OUT1 becomes a high level, as shown in FIG. 4. Since the gate voltage of the FET 128 is equal to the voltage on the node N2, the FET 128 is turned on when the voltage on the node N2 increases beyond a predetermined value. At this time, the FETs 114 and 132 are in their OFF state, so that the current flows out to the succeeding circuit via the output terminal 138 within the range determined by the capacity of the FET 128.

On the outflow of the current as stated above, the FET 116 is turned on to lower the voltage on the node N3. When the voltage on the node N3 is sufficiently lowered below the second reference voltage VR2, the FET 134 is turned on to cause the output voltage OU2 to become a low level, as shown in FIG. 4. Since the gate voltage of the FET 130 is equal to the voltage appearing on the node N3, the FET 130 is turned off when the voltage on the node N3 drops beyond a predetermined value. At this moment, the FETs 116 and 134 remain turned off and, hence, a current flows into the amplifying circuit via the output terminal 140 within the range determined by the drive capacity of the FET 126.

The illustrative embodiment having the construction shown in FIG. 3 achieves various advantages, as follows.

Figure 1:
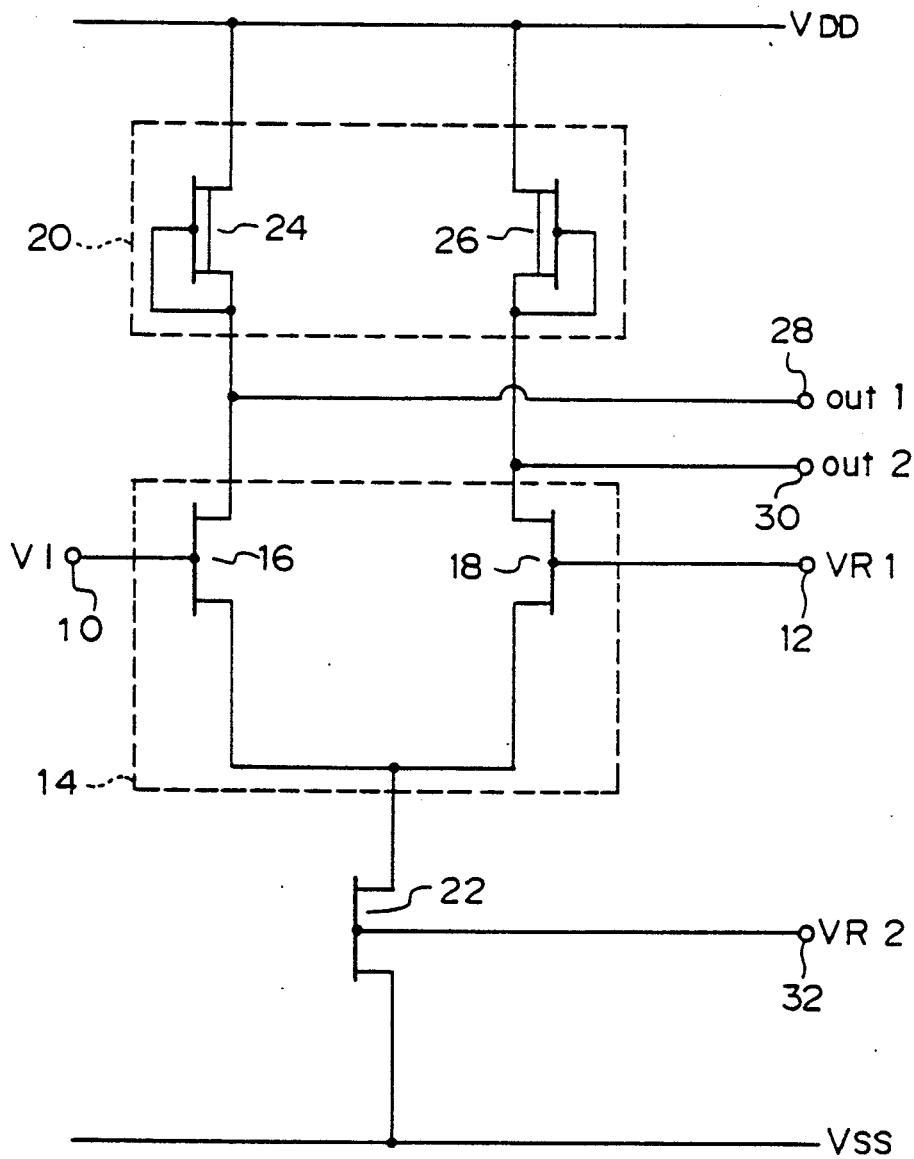
FIG. 1 is a diagram showing a prior art differential amplifying circuit.
Figure 2:
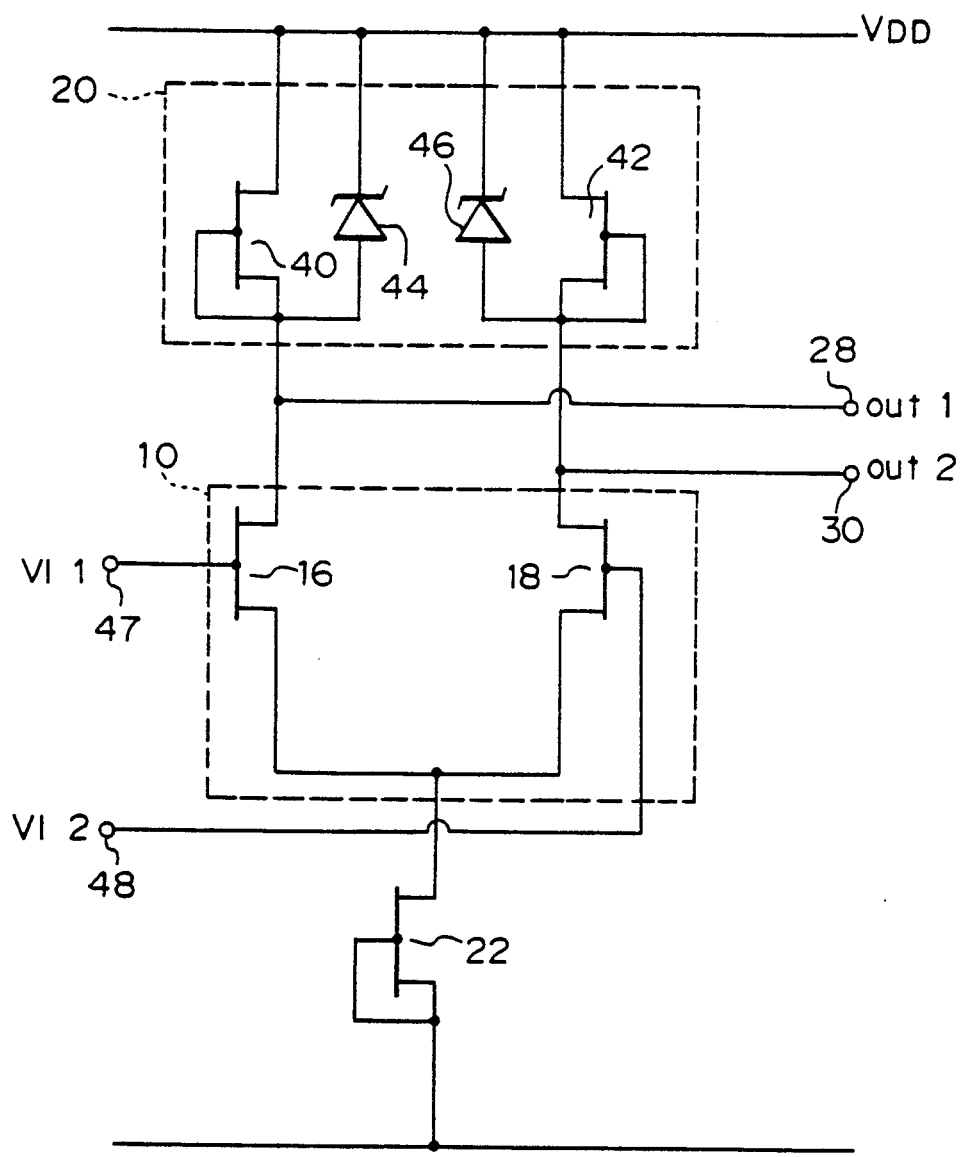
FIG. 2 is a diagram showing another prior art differential amplifying circuit.
Figure 5:
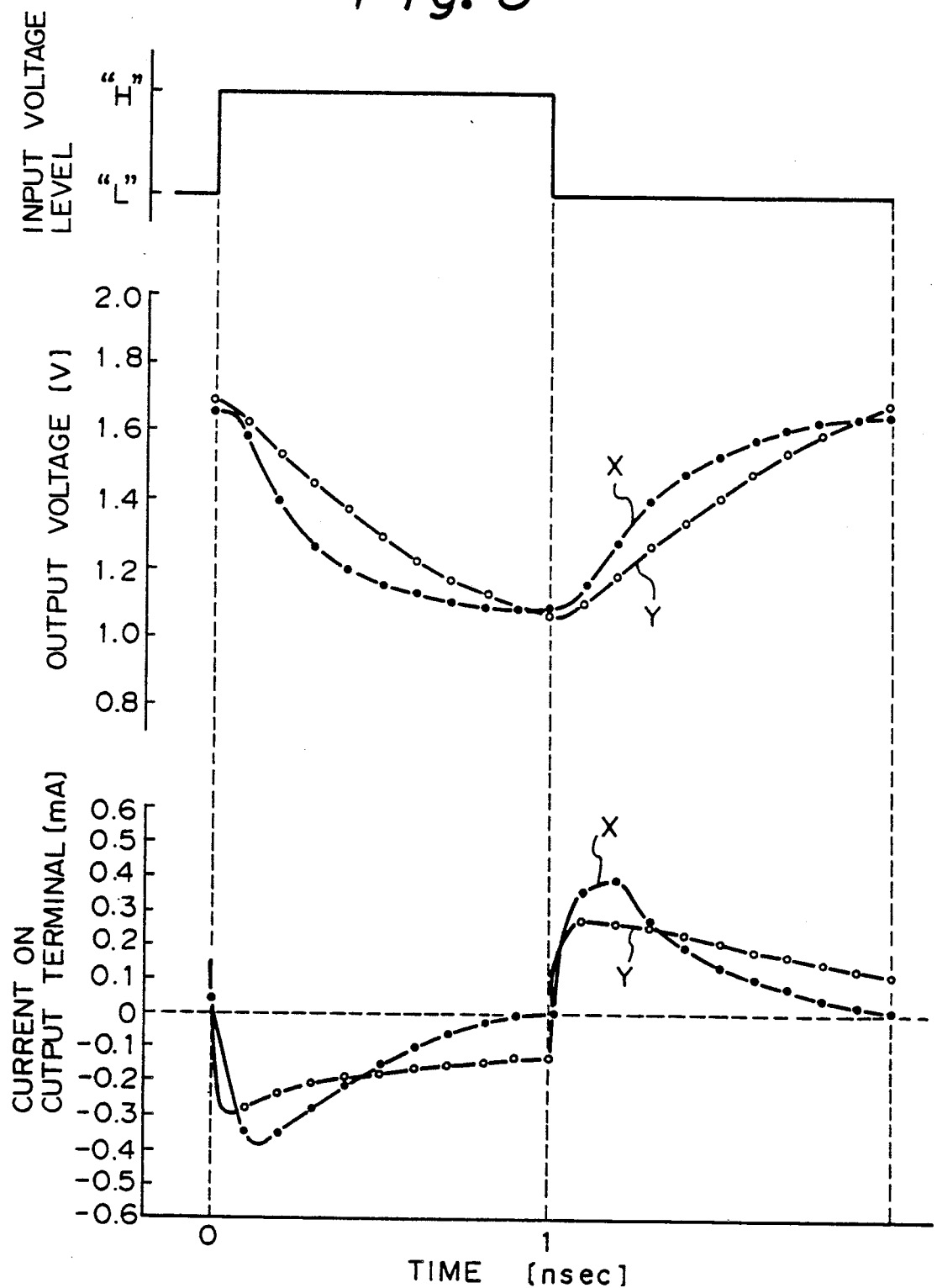
FIG. 5 is a chart useful for understanding the difference in operation between the prior art circuit of FIG. 1 and the illustrative embodiment of FIG. 3.

FIG. 5 is a graph comparing the operation of the illustrative embodiment with that of the prior art circuitry of FIG. 1. Specifically, the curves shown in FIG. 5 simulate the relationship between the current and output voltage on the output terminal and the time, on the assumption that the constant current sources of the circuits shown in FIGS. 1 and 3 are the same, and that the load acting on the output terminal is 0.3 picofarad. In FIG. 5, curves labeled X and Y are associated with the circuits of FIGS. 3 and 1, respectively. As shown, the operation X of the illustrative embodiment achieves greater incoming and outgoing currents than the operation Y of the prior art, because the FETs 128, 130, 132 and 134 turn on and off. Such incoming and outgoing currents allow the output voltage level to settle rapidly.

In the circuit shown in FIG. 3, an arrangement may be made such that the first reference voltage VR1 coincides with the center of the levels of the input voltage VI, and the second reference voltage VR2 coincides with the center of the logical amplitude levels which are determined by the current ratio in the conductive state of the FETs 114, 116, 128, 130 and 126. Then, the on-off operations of the FETs 128, 130, 132 and 134 serve to set cause the logical levels of the nodes N2 and N3 or those of the output terminals 138 and 140 to settle more rapidly. This is successful in further promoting high-speed operations and in increasing the sensitivity.

The conduction of the FET 128 is controlled by the voltage appearing on the node N2, while the conduction of the FET 130 is controlled by the voltage appearing on the node N3. Hence, even when a circuit having a great load capacitance is connected to the output side of the circuit shown in FIG. 3 and requires the latter to supply a great current thereto, a sufficient current is insured up to the limit which depends on the capacity of the FET 126. Therefore, the circuit is operable at high speed.

Since the FETs 128 and 130 serving as load elements are implemented as depletion type FETs whose ON resistance is comparatively small, a large current can be fed to the succeeding circuit and, yet, the power consumption is reduced.

Figure 6:
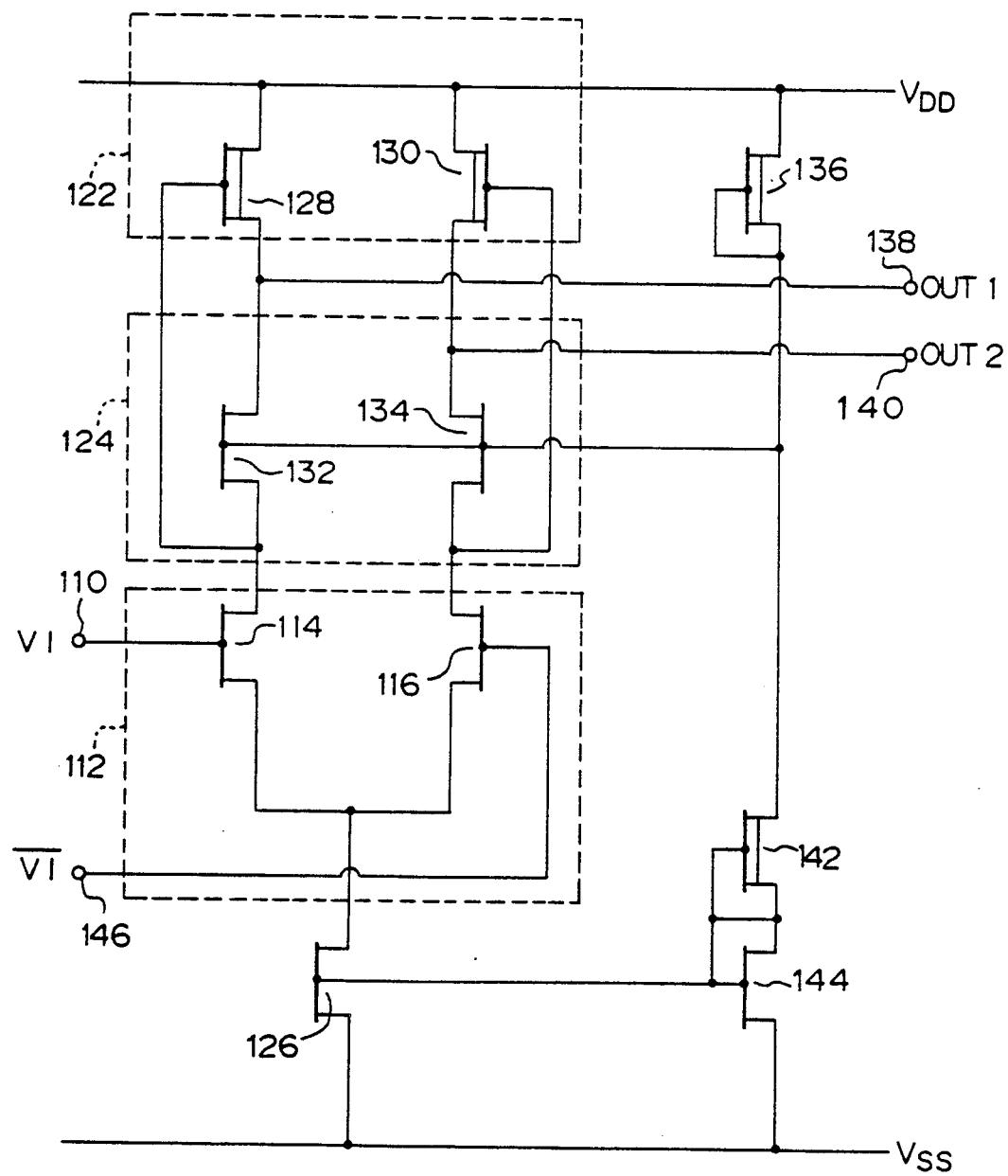
FIG. 6 is a diagram showing an alternative embodiment of the differential amplifying circuit in accordance with the present invention.

Referring to FIG. 6, an alternative embodiment of the differential amplifying circuit in accordance with the present invention is shown. In FIG. 6, the same components as those shown in FIG. 3 are designated by like reference numerals, and redundant descriptions will be avoided for simplicity. The circuit of FIG. 6 differs from the circuit of FIG. 3 in that the resistors 118 and 120 for generating the first reference voltage VR1 are omitted, and that an input voltage $\overline{VI}$ opposite in phase to the input voltage VI coming in from the outside is applied to the gate of the FET 116. Specifically, the input voltage $\overline{VI}$ is applied to a second input terminal 146. Regarding the operation, the alternative embodiment is essentially the same as the previous embodiment. When the input voltage $\overline{VI}$ opposite in phase to the input voltage VI is applied to the gate of the FET 116 as mentioned, the FETs 114 and 116 are operated at the same time. Hence, this embodiment achieves even higher operating speed and sensitivity than the previous embodiment.

Figure 7:
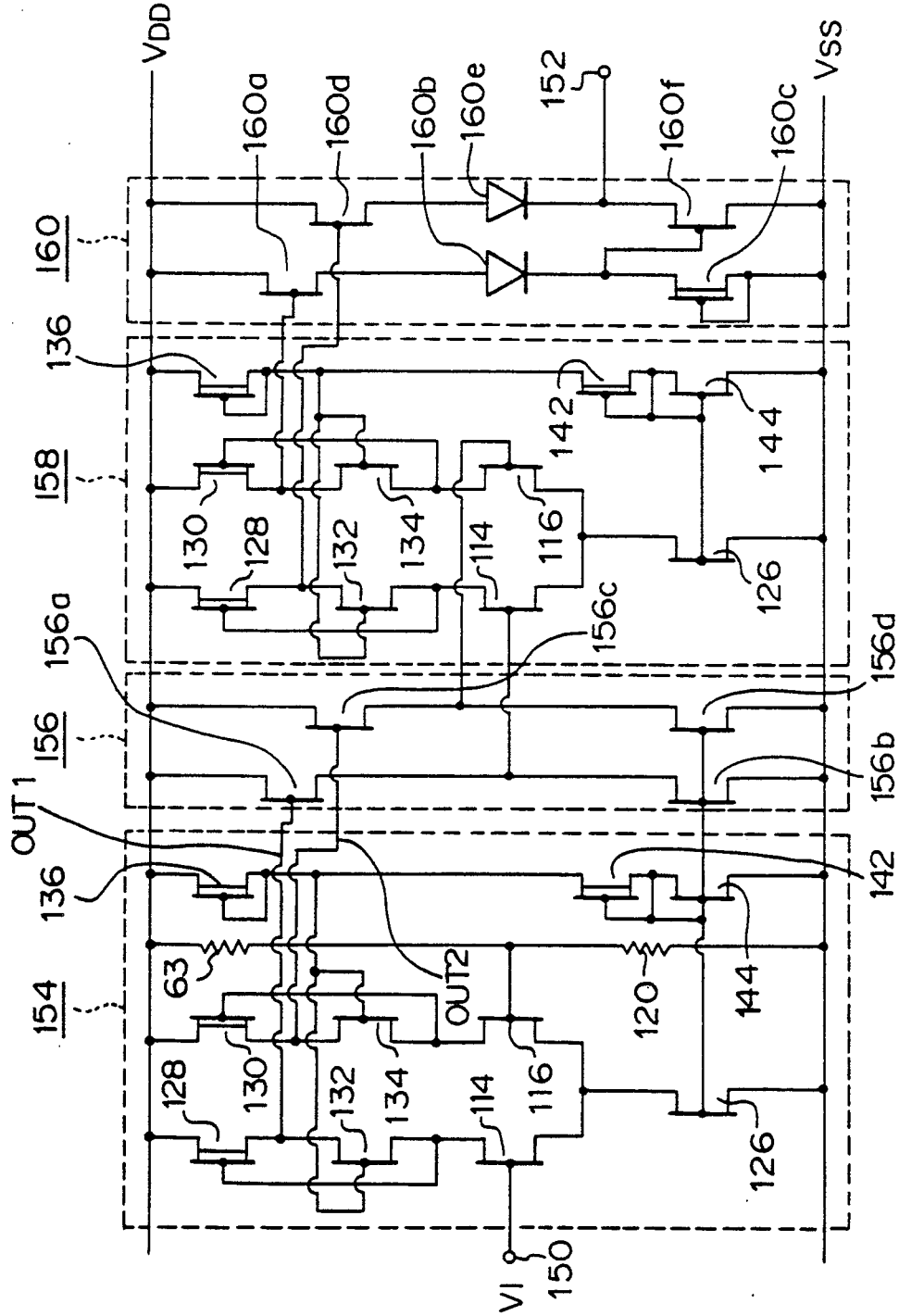
FIG. 7 is a diagram representative of a specific application of the illustrative embodiments.

FIG. 7 is a diagram showing an input circuit which is a specific application of the illustrative embodiments state above with reference to FIGS. 3 and 6. In the figures, the same components are designated by like reference numerals, and redundant descriptions will be avoided for simplicity. As shown, the input circuit has an input terminal 150 to which an input voltage VI is applied, and an output terminal 152. A differential amplifying circuit 154, a level shifting circuit 156, a differential amplifying circuit 158, and a level shifting circuit 160 are cascaded in this order between the input terminal 150 and the output terminal 152. The differential amplifying circuits 154 and 158 are implemented by the illustrative embodiments shown in FIGS. 3 and 6, respectively.

The level shifting circuit 156 is made up of a series connection of normally OFF FETs 156a and 156b intervening between power source voltages VDD and VSS, and a series connection of normally OFF FETs 156c and 156d also intervening between the power source voltages VDD and VSS. The level shifting circuit 156 has a function of lowering the voltage to below the input voltage VI. The gates of the FETs 156a and 156c are respectively connected to the output voltages OUT1 and OUT2 of the differential amplifying circuit 154. The gates of the FETs 156b and 156d are connected to the gate of the FET 144 of the differential amplifier 154. The output voltage between the FETs 156a and 156b and the output voltage between the FETs 156c and 156d are connected to the differential amplifier 158, while the output voltage of the differential amplifier 158 is in turn connected to the level shifting circuit 160.

The level shifting circuit 160 has an enhancement type FET 160a, a diode 160b for shifting the level, and a depletion type FET 160c adapted for a load. The FET 160a, diode 160b and FET 160c are connected in series between the power source voltages VDD and VSS. Also connected in series between the power source voltages VDD and VSS are a depletion type FET 160d, a diode 160e, and an enhancement type FET 160f. The level shifting circuit 160 is connected to the output terminal 152 between the diode 160e and the enhancement type FET 160f.

Assume that the input circuit shown in FIG. 7 is implemented as an input level transforming circuit, and that it is used to transform a voltage level width from the ECL level (0.3 volt in peak-to-peak value) to the DCFL level (0.6 volt in peak-to-peak value) using gallium arsenide. Simulations were conducted by using the input circuit of FIG. 7 under particular characteristic conditions: gate length $Lg = 1$ micron, threshold voltage of depletion type FET $Vtd = -819$ millivolts, constant of depletion type FET $Kd = 1.22$ milliamperes per square volt, threshold voltage of enhancement type FET $Vte = +79$ millivolts, and constant of enhancement type FET $Ke = 2.10$ milliamperes per square volt. It was found that the clock frequency under the above conditions is 2.5 gigahertz and, therefore, the input circuit is operable at high speed.

In summary, a differential amplifying circuit in accordance with the present invention has a fifth switching FET connected between the first switching FET and the third load FET, and a sixth switching FET connected between the second switching FET and the fourth load FET. The fifth and sixth FETs are turned on and off to change the amount of current flow sharply, so that the logical levels of various nodes settle within a short period of time and, in addition, the sensitivity is enhanced.

The conduction of the third FET and that of the fourth FET are controlled by voltages appearing on first and second nodes, respectively. Hence, even when a circuit having a high load capacitance is connected to the output side and requires a large current, a sufficient current is insured up to the limit which depends on the drive capacity of the load FETs and the supply capacity of a constant current source. This is successful in promoting rapid operations.

Furthermore, by implementing the third and fourth FETs as depletion type FETs whose ON resistance is relatively small, it is possible to feed a great current to a succeeding circuit while achieving a power saving effect.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. For example, the enhancement type FETs 114, 116, 132 and 134 of the illustrative embodiments may be replaced with depletion type FETs. When the enhancement type FETs 114 and 116 are replaced with depletion type FETs, it is necessary to lower the reference voltage VR1 to a level at which the FETs 114 and 116 are operable. Likewise, when the FETs 132 and 134 are replaced with depletion type FETs, it is necessary to lower the reference voltage VR2. Further, the enhancement type FET 126 serving as a constant current source may be replaced with a FET whose gate and source are short-circuited or even with a resistor.

What is claimed is:

1. A differential amplifier circuit comprising:
   a first input port for receiving an input voltage;
   a first field effect transistor (FET) having a drain, a source and a gate which is responsive to said input voltage to control conduction between said drain and said source;
   a second FET having a drain, a source and a gate which is responsive to a first reference voltage to control conduction between said drain and said a source of said second FET, said source of said second FET being connected to said source of said first FET;
   a constant current source connected to said sources of said first and second FETs for supplying a constant current from said sources of said first and second FETs to a low potential power source;
   a third FET having a drain connected to a high potential power source and having a source connected to a first output port to act as a load, said third FET having a gate connected to a first node which is connected to said drain of said first FET;
   a fourth FET having a drain connected to said high potential power source and having a source connected to a second output port to act as a load, said fourth FET having a gate connected to a second node which is connected to said drain of said second FET;
   a fifth FET having a drain connected to said source of said third FET and a source connected to said first node, said fifth FET having a gate which is responsive to a second reference voltage to control conduction between said drain and said source of said fifth FET; and
   a sixth FET having a drain connected to said source of said fourth FET and having a source connected to said second node, said sixth FET having a gate which is connected to said gate of said fifth FET and which is responsive to said second reference voltage to control conduction between said drain and said source of said sixth FET, said second reference voltage being independent of the conduction of said first through sixth FETs.

2. A circuit in accordance with claim 1, wherein said third and fourth FETs each comprises a depletion type FET.

3. A circuit in accordance with claim 1, wherein said first, second, fifth and sixth FETs each comprises an enhancement type FET.

4. A circuit in accordance with claim 1, wherein said first, second, fifth and sixth FETs each comprises a depletion type FET.

5. A circuit in accordance with claim 1, wherein said constant current source comprises an enhancement type FET.

6. A circuit in accordance with claim 1 further comprising a voltage divider connected to said high and low potential power sources and to said gate of said second FET for dividing a voltage supplied from said high and low potential power sources to produce said first reference voltage.

7. A circuit in accordance with claim 1 further comprising a second input port connected to said gate of said second FET for receiving a voltage which is opposite in phase to said input voltage to provide said gate of said second FET with first reference voltage.

* * * * *